United States Patent
Yamazaki et al.

(10) Patent No.: US 6,304,144 B1
(45) Date of Patent: Oct. 16, 2001

(54) DIFFERENTIAL AMPLIFICATION CIRCUIT

(75) Inventors: Daisuke Yamazaki; Seiichi Ozawa, both of Kanagawa (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/351,403

(22) Filed: Jul. 9, 1999

(30) Foreign Application Priority Data

Jul. 10, 1998 (JP) .................................................. 10-195215

(51) Int. Cl.$^7$ ..................................................... H03F 3/45
(52) U.S. Cl. ........................... 330/259; 327/307; 327/11; 327/69; 327/302
(58) Field of Search ................................. 330/11, 69, 85, 330/259, 306, 302; 327/307

(56) References Cited

U.S. PATENT DOCUMENTS

| | | | |
|---|---|---|---|
| 3,435,362 | * | 3/1969 | Pamlenyi .............................. 330/69 |
| 3,958,185 | * | 5/1976 | Hartung ............................... 330/259 |
| 4,525,677 | * | 6/1985 | Rorden .................................. 330/85 |

FOREIGN PATENT DOCUMENTS

| | | |
|---|---|---|
| 59-207 | 1/1984 | (JP) . |
| 59-183516 | 10/1984 | (JP) . |
| 1-170214 | 7/1989 | (JP) . |
| 2-62821 | 5/1990 | (JP) . |
| 2-177706 | 7/1990 | (JP) . |
| 4-217105 | 8/1992 | (JP) . |
| 5-259752 | 10/1993 | (JP) . |
| 6-152281 | 5/1994 | (JP) . |

* cited by examiner

*Primary Examiner*—Michael B Shingleton
(74) *Attorney, Agent, or Firm*—Helfgott & Karas, P.C.

(57) ABSTRACT

DC components are removed by a first and a second capacitor from a normal signal and its inverted signal from a first and a second input terminal, and the signals are input to a DC level generating circuit. The DC level generating circuit newly adds a DC component to the respective signals from which the DC components are removed by the first and the second capacitors, and extracts only a DC voltage from a feedback voltage with a low-pass filter using the fist and the second capacitors. The circuit of the DC level generating circuit which includes the low-pass filter using the first and the second capacitors is configured so that a high-frequency cut-off frequency other than that included into a loop gain by the low-pass filter is not included. Consequently, only one high-frequency cut-off frequency exists in the loop gain, thereby preventing a feedback circuit from oscillating.

8 Claims, 8 Drawing Sheets

DIFFERENTIAL AMPLIFICATION CIRCUIT

BACKGROUND OF THE INVENTION

1. Field of the Invention

The present invention relates to input offset compensation in a DC (Direct Current) feedback differential amplification circuit.

2. Description of the Related Art

Conventionally, a DC feedback circuit used to stabilize a DC component of an input voltage is utilized with a single input.

Figure 1:
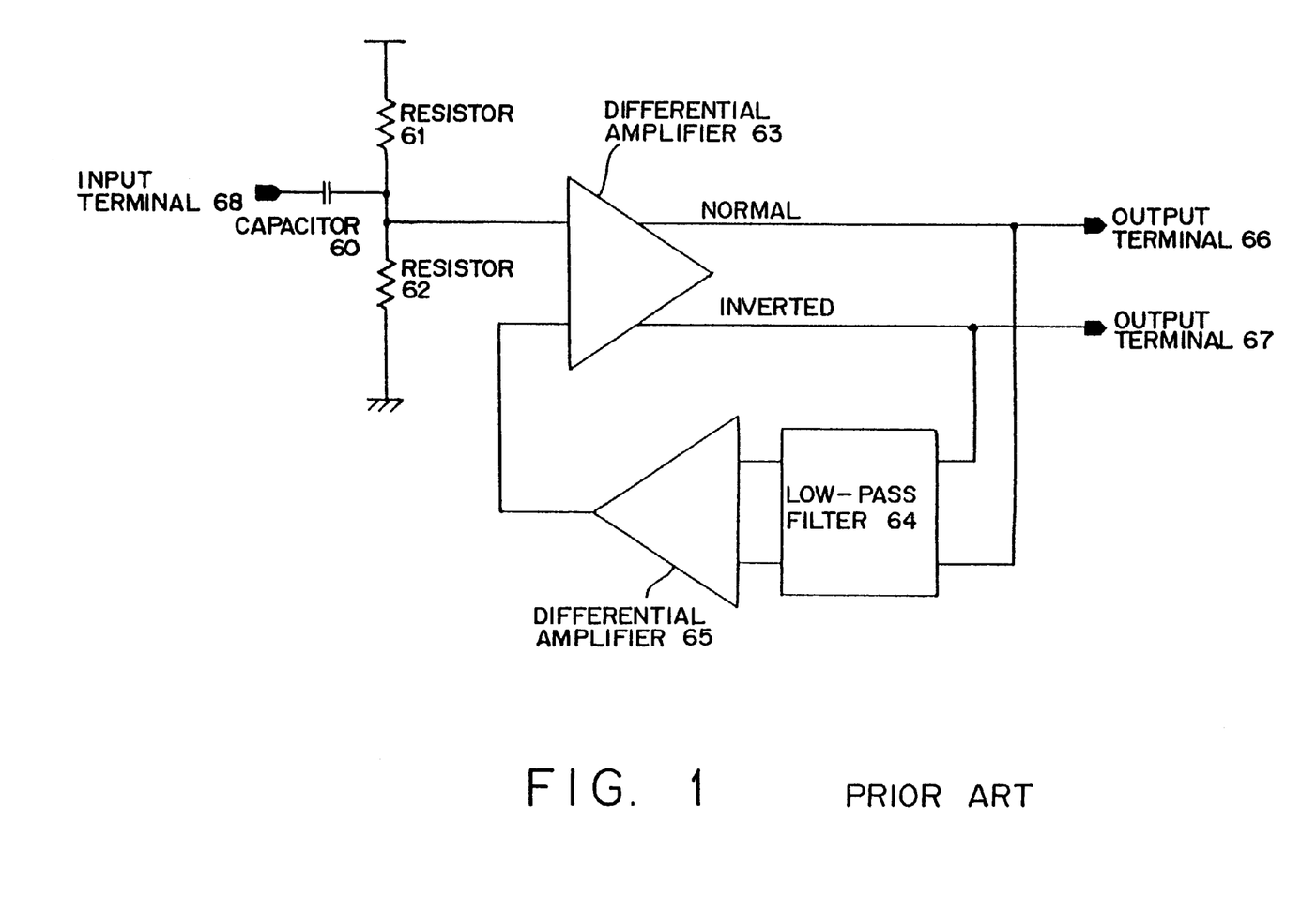
FIG. 1 exemplifies the configuration of a single-input differential amplification feedback circuit.

FIG. 1 exemplifies the configuration of a single-input differential amplification feedback circuit.

A DC component is removed by an operation of a capacitor 60 from a signal from an input terminal 68, and only an AC (Alternating Current) component is extracted. A DC component generated by a voltage drop caused by resistors 61 and 62 is added to the signal which includes only the AC component, and the resultant signal is input to one of input terminals of a differential amplifier 63. A normal signal obtained by amplifying the above described signal and its inverted signal are output from a differential amplifier 63. Here, a feedback path is formed in order to stabilize the DC components. That is, in the configuration shown in FIG. 1, the normal output and the inverted output of the differential amplifier 63 are input to a low-pass filter 64. After their DC components are extracted, these signals are input to a differential amplifier 65. The differential amplifier 65 amplifies and outputs a difference between the DC component of the normal output of the differential amplifier 63 and that of the inverted output, and inputs the difference to the other of the input terminals of the differential amplifier 63. By arranging the path for feeding back only the DC component, the DC components of the signals output from output terminals 66 and 67 are stabilized and output.

However, in the above described single-input amplification circuit, unless the gain of the differential amplifier 63 are sufficiently increased for a predetermined input voltage from the input terminal 68, it is insufficient for amplifying, for example, a signal which is much attenuated within an SAW filter and output therefrom. Accordingly, a normal signal and its inverted signal are considered to be input to the differential amplifier 63. In this way, the amplitude of a signal can be substantially doubled, and at the same time, an S/N ratio can be improved on the condition that the level of noise is approximate to that in the case of a single input.

Figures 2A, 2B:
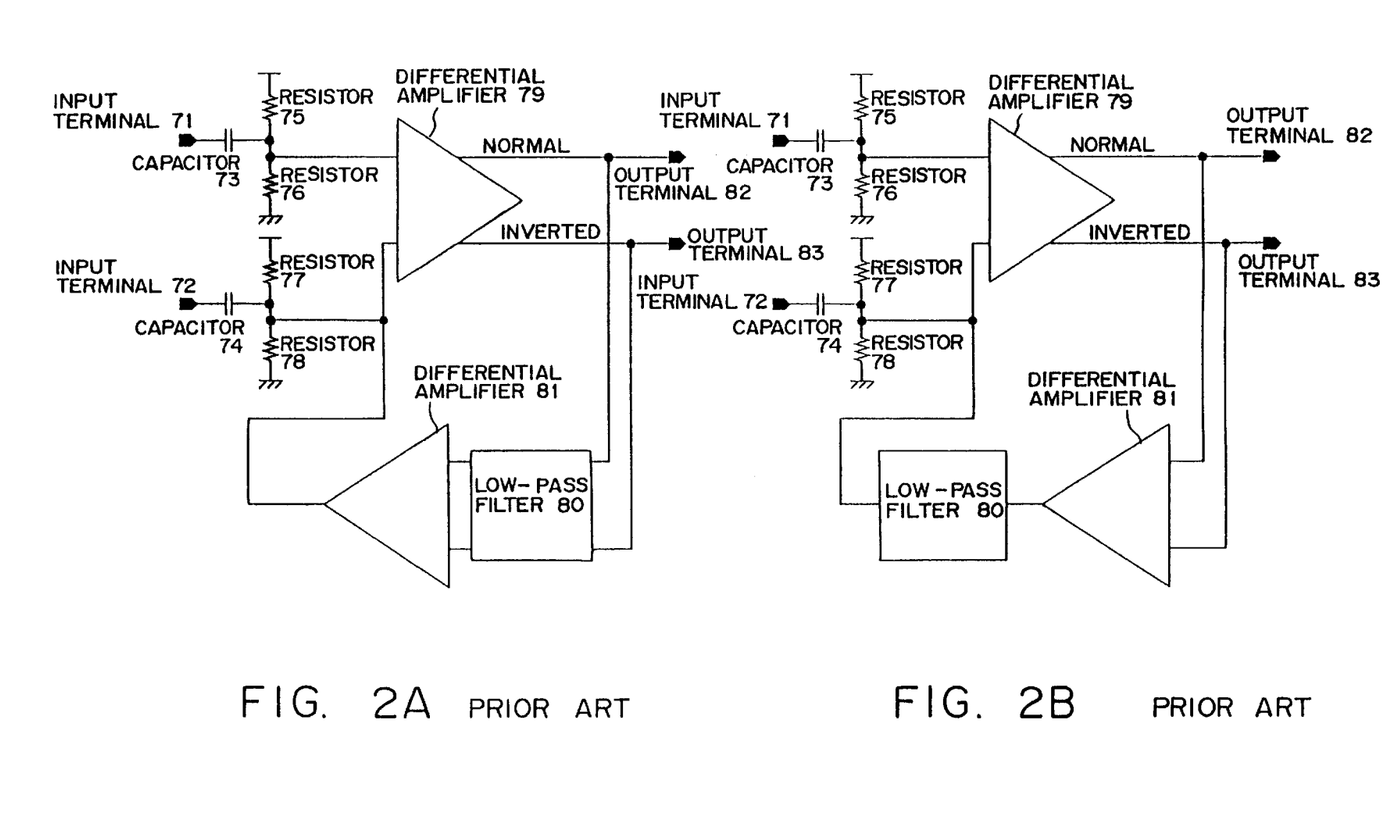
FIGS. 2A and 2B exemplify the configurations of a conventional DC feedback differential amplification circuit when a differential input is made.

FIGS. 2A and 2B exemplify the configurations of a conventional DC feedback differential amplification circuit when a differential input is made.

Considered as the DC feedback configuration for compensating for the offset between DC components when the differential input is made is a configuration in which a low-pass filter 80 having a high-frequency cut-off frequency "fc1" in order to feed back a DC component to the input is added as shown in FIG. 2A or 2B.

In FIG. 2A, a normal signal of a signal to be input is input from an input terminal 71, while an inverted signal of the signal to be input is input from an input terminal 72. A DC component is removed by a capacitor 73 from the signal from the input terminal 71. The DC component set by resistors 75 and 76 is newly added to this signal, which is input to one of terminals of a differential amplifier 79. A DC component is removed by a capacitor 74 also from the inverted signal from the input terminal 72, and a DC component set by the resistors 77 and 78 is newly added. This signal then is input to the other of the terminals of the differential amplifier 79. The differential amplifier 79 outputs to an output terminal 82 a normal signal obtained by amplifying the difference between the inputs from the two terminals, and outputs the inverted signal of the amplified signal to an output terminal 83. The signals to be output to the output terminals 82 and 83 are input to a low-pass filter 80 via feedback paths. The low-pass filter extracts DC components, and the signals are input to a differential amplifier 81. The differential amplifier amplifies the difference between the two DC voltage, and feeds back the amplified difference to the input side of the inverted signal of the differential amplifier 79. In such a configuration, if there is a difference between the DC components of the signals to be fed to the output terminals 82 and 83, the difference is amplified by the differential amplifier 81 and again input to the differential amplifier 79. As a result, the DC components of the signals to be fed to the output terminals 82 and 83 can be matched, thereby compensating for the offset between the DC components.

FIG. 2B shows a modification of the configuration shown in FIG. 2A.

In the configuration shown in FIG. 2A, the positions at which the low-pass filter 80 and the differential amplifier 81 on the feedback paths are arranged are reversed from those shown in FIG. 2A. However, their operations are the same as those of the configuration shown in FIG. 2A.

That is, the signal input from the input terminal 72 is an inversion of the signal from the input terminal 71. DC components are removed from the signals by the capacitors 73 and 74 from the signals from the input terminals 71 and 72. The respective DC components set by the resistors 75 and 76, and 77 and 78 are newly added, and the signals are input to the differential amplifier 79. The normal and the inverted outputs of the differential amplifier 79 are fed to the differential amplifier 81 via feedback paths, and the difference between the normal and the inverted outputs is amplified, and the amplified difference is input to the low-pass filter 80. The low-pass filter 80 extracts only a DC component, and feeds back the extracted component to the differential amplifier 79. Also in this case, if the DC components of the outputs of the output terminals 82 and 83 are large, a corresponding DC voltage is input from the low-pass filter 80 to the differential amplifier 79, so that the difference between the DC components of the normal and the inverted outputs of the differential amplifier 79, is eliminated. Since the offset between the DC components is cancelled and output as described above, the normal and the inverted signals whose DC component values are matched are output.

In the conventional circuitry shown in FIG. 2A or 2B, a high-frequency cut-off frequency "fc1" of the low-pass filter arranged for removing only a high frequency component and feeding back only a DC component exists within a DC feedback loop. In addition, a high-frequency cut-off frequency "fc2" is caused within a DC feedback loop by the output impedance of the capacitor 74 which is intended to remove a DC component of an input signal and to input only a high frequency component, and the differential amplifier 81. The high-frequency cut-off frequency "fc1" must be sufficiently low for the frequency of the signal so as to perform a DC feedback operation. Also the high-frequency cut-off frequency "fc2" must be low so as to increase the value of the capacitor 74 in consideration of the same code succession of the signal. Furthermore, the gain of the DC feedback loop must be increased so as to reduce the compression residual of the offset. In this case, a sufficient phase margin cannot be secured for the gain of the feedback loop, which leads to oscillation of the feedback loop.

Figure 3:
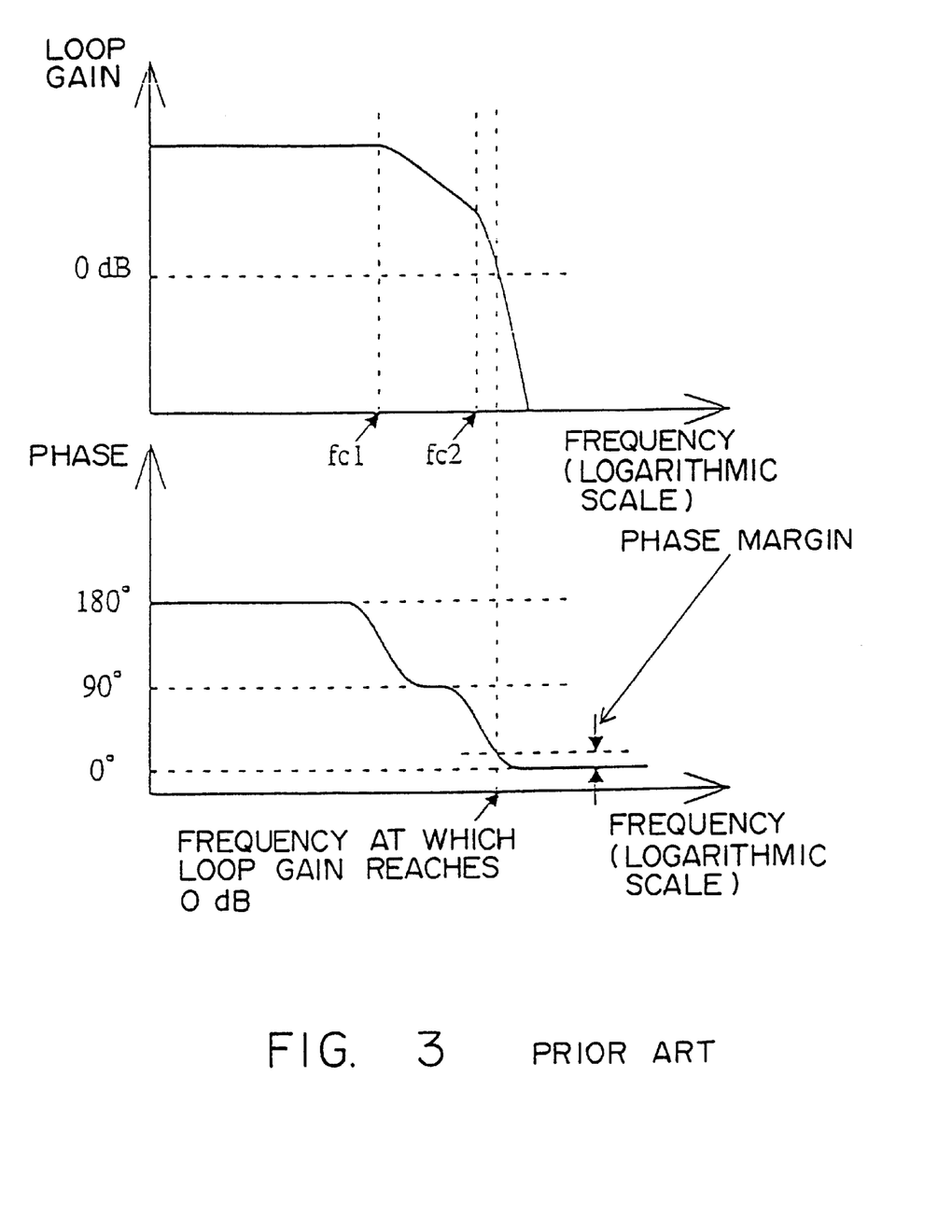
FIG. 3 explains a phase margin in the circuitry shown in FIGS. 2A and 2B.

FIG. 3 explains a phase margin in the circuitry shown in FIGS. 2A and 2B.

As shown in the upper stage, the loop gain decreases as the frequency increases. Especially, the loop gain significantly decreases at the high-frequency cut-off frequencies "fc1" and "fc2". The loop gain becomes smaller than 0 dB at a certain frequency. The phase of the loop gain starts to rotate at the high-frequency cut-off frequencies "fc1" and "fc2". At the high-frequency cut-off frequency "fc1", the phase shifts from 180° to 90°. When the phase exceeds the high-frequency cut-off frequency "fc2", the phase starts to decrease from 90° and finally reaches 0°. For the feedback loop, the phase of the feedback loop itself starts to oscillate if it is close to 0° at the frequency where the loop gain reaches 0 dB, which leads to a circuit malfunction. The phase of the loop gain at the frequency where the loop gain becomes 0 dB is referred to as a phase margin. Normally, the phase margin required to suppress oscillation is 45°. However, a phase margin of 45° or more cannot be secured in the circuitry shown in FIGS. 2A and 2B, which causes oscillation. Accordingly, measures must be taken to decrease the absolute value of the loop gain in such circuitry. At the same time, however, a contradictory demand for increasing the loop gain must be satisfied in order to improve the offset compensation effect of the circuitry.

SUMMARY OF THE INVENTION

An object of the present invention is to provide a circuitry configuration which can sufficiently secure a phase margin of a loop gain in a DC feedback differential amplification circuit.

A DC feedback differential amplification circuit as a first aspect of the present invention comprises: a capacitor for removing a DC component of an input signal; a differential amplifier for differentially amplifying the input signal; a feedback path for feeding back the output of the differential amplifier; and a DC level generating circuit, to which the signal from the feedback path is input, for extracting the DC component of the signal from the feedback path by using the capacitor, and for inputting the DC component to the differential amplifier, wherein the DC level generating circuit is configured so that two or more high-frequency cut-off frequencies are not included into the feedback path within a frequency band where a loop gain is larger than 0 dB.

A differential amplification circuit as a second aspect of the present invention comprises: a first capacitor connected to a first input terminal; a second capacitor connected to a second input terminal; a first differential amplifier; and a DC level generating circuit whose input side is connected to the first and the second capacitors, and whose output side is connected to the first differential amplifier; and a second differential amplifier which is connected to the output side of the first differential amplifier and is further connected to the DC level generating circuit, wherein the DC level generating circuit is configured so that only one high-frequency cut-off frequency is included into the feedback loop, which is composed of the DC level generating circuit, the first differential amplifier, and the second differential amplifier, within a frequency band where a loop gain is larger than 0 dB.

Since only one high-frequency cut-off frequency occurs within a feedback circuit according to the present invention as described above, the phase (phase margin) of a loop gain when the loop gain becomes 0 dB can be increased to 45° or more. Therefore, the phase margin the size of which is normally required to suppress the oscillation of the feedback circuit can be secured, thereby configuring a differential amplification circuit which compensates for an input offset without oscillating the feedback circuit.

DESCRIPTION OF THE PREFERRED EMBODIMENTS

Figure 4A:
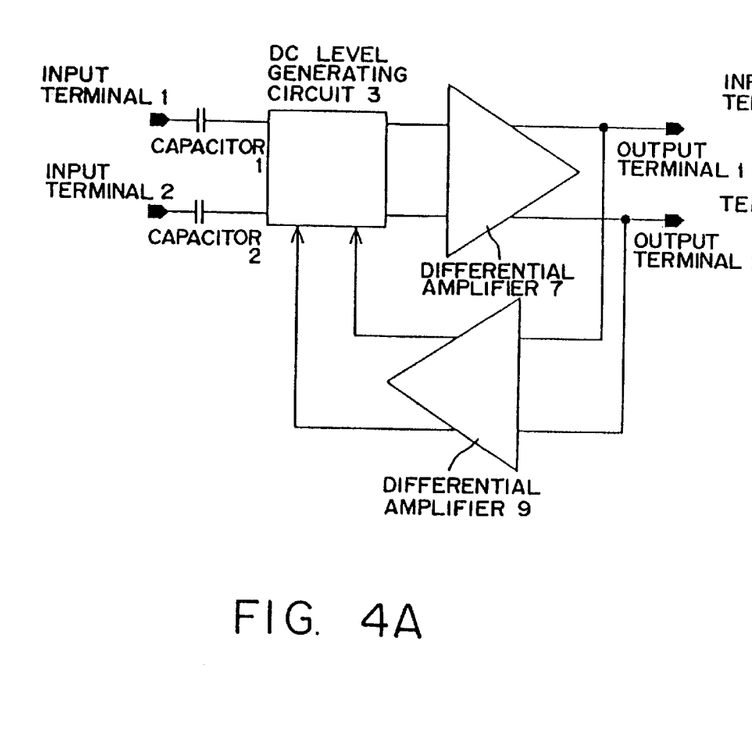
FIGS. 4A and 4B explain the principle of the present invention.
Figure 4B:
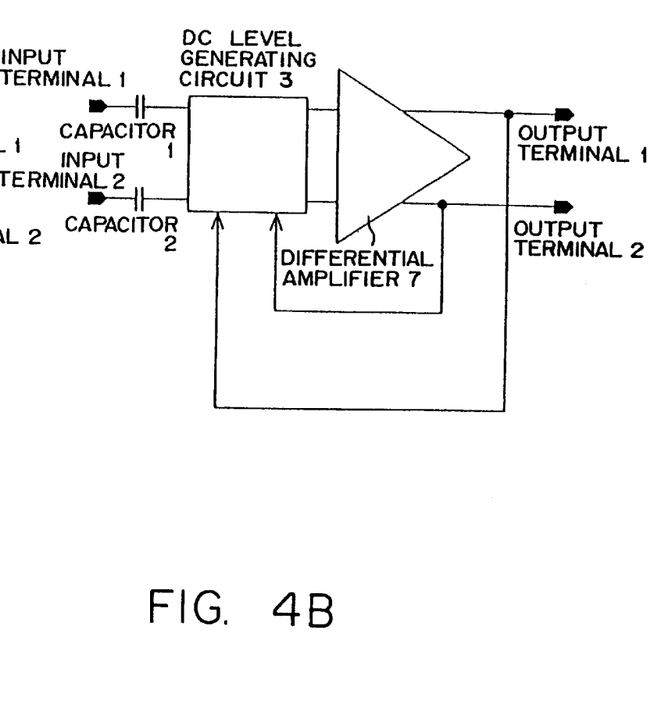

FIGS. 4A and 4B explain the principle of the present invention.

According to the present invention, a capacitor 2 intended to remove a DC component from an input signal and to extract only a high frequency component is also used as a low-pass filter for removing a high frequency component in a DC feedback within an offset compensating circuit which feeds back inputs without using a low-pass filter so far added.

FIG. 4A is a block diagram showing the principle of the present invention.

In this figure, a normal signal and its inverted signal are respectively fed to input terminals 1 and 2. Capacitors 1 and 2 performs the operation for removing DC components from the input signals. A DC level generating circuit 3 newly adds a DC component to the input signals from which the DC components are removed by the capacitors 1 and 2, removes high frequency components from the signals from the differential amplifier 9, and extracts only DC components. At this time, the DC level generating circuit 3 is configured not to include a circuit for extracting a DC component by itself, such as a low-pass filter, that is, the circuit for newly feeding a high-frequency cut-off frequency into the loop gain of a feedback circuit.

Alternatively, the DC level generating circuit 3 configures a circuit equivalent to a low-pass filter by using resistors and either or both of capacitors 1 and 2 for removing a DC component from an input signal, and extracts only a DC component from the signal from the differential amplification circuit 9. Accordingly, the normal signal and its inverted signal from the input terminals 1 and 2 are input to a differential amplifier 7, which differentially amplifies the signals, and at the same time, the normal and the inverted outputs of the differential amplifier 7 are amplified by a differential amplifier 9 via feedback paths. The amplified outputs are converted into DC voltages and input to the differential amplifier 7.

Accordingly, with the operations of the DC level generating circuit 3, an offset compensation differential amplifier for feeding back a DC component can be configured in a similar manner as in conventional circuitry. Moreover, the DC level generating circuit 3 is configured without newly including a high-frequency cut-off frequency into a feedback loop like a low-pass filter. Therefore, the high-frequency cut-off frequencies added to the loop gain of the feedback path is only the frequencies added by the capacitors 1 and 2 and the DC level generating circuit 3.

As referred to in the explanation about the conventional configuration, the phase of a loop gain at a frequency where the loop gain becomes 0 dB must be 45° or more so as to prevent a feedback circuit from oscillating. According to the present invention, however, only one high-frequency cut-off frequency exists in a frequency band where the gain of a feedback loop is larger than 0 dB, and the phase of the loop gain once rotates by 90° at the high-frequency cut-off frequency or its vicinity. Accordingly, a sufficient phase margin can be secured, thereby preventing a feedback circuit from oscillating.

FIG. 4B shows a modification of the configuration shown in FIG. 4A. The same constituent elements as those shown in FIG. 4A are denoted with the same reference numerals in this figure.

In FIG. 4B, the differential amplifier 9 (shown in FIG. 4A) arranged on the feedback paths is deleted in FIG. 4B. Also in this case, the operations of the circuitry are the same. The amplification operation of a loop gain on the feedback paths, which falls into two such as the differential amplifiers 7 and 9 in FIG. 4A, is performed by the differential amplifier 7 alone. Also in this case, the DC level generating circuit 3 is configured to add a high-frequency cut-off frequency to a loop gain by using the capacitors 1 and 2.

Accordingly, only one high-frequency cut-off frequency is added to the gain of the feedback loop in a frequency band where the loop gain is larger than 0 dB, in a similar manner as in the case explained by referring to FIG. 4A. Consequently, a phase margin of 45° or more can be secured, thereby preventing a feedback circuit from oscillating.

As described above, according to the present invention, two high-frequency cut-off frequencies that conventionally existed can be reduced to one, which eliminates a possibility of oscillation without adopting an unnecessarily low high-frequency cut-off frequency.

Especially, when a differential amplification circuit is put into an IC, the capacitors 73 and 74 of FIG. 2A or 2B are externally attached in many cases since they must be large. According to the present invention, however, also the number of externally attached components can be reduced.

Figure 5:
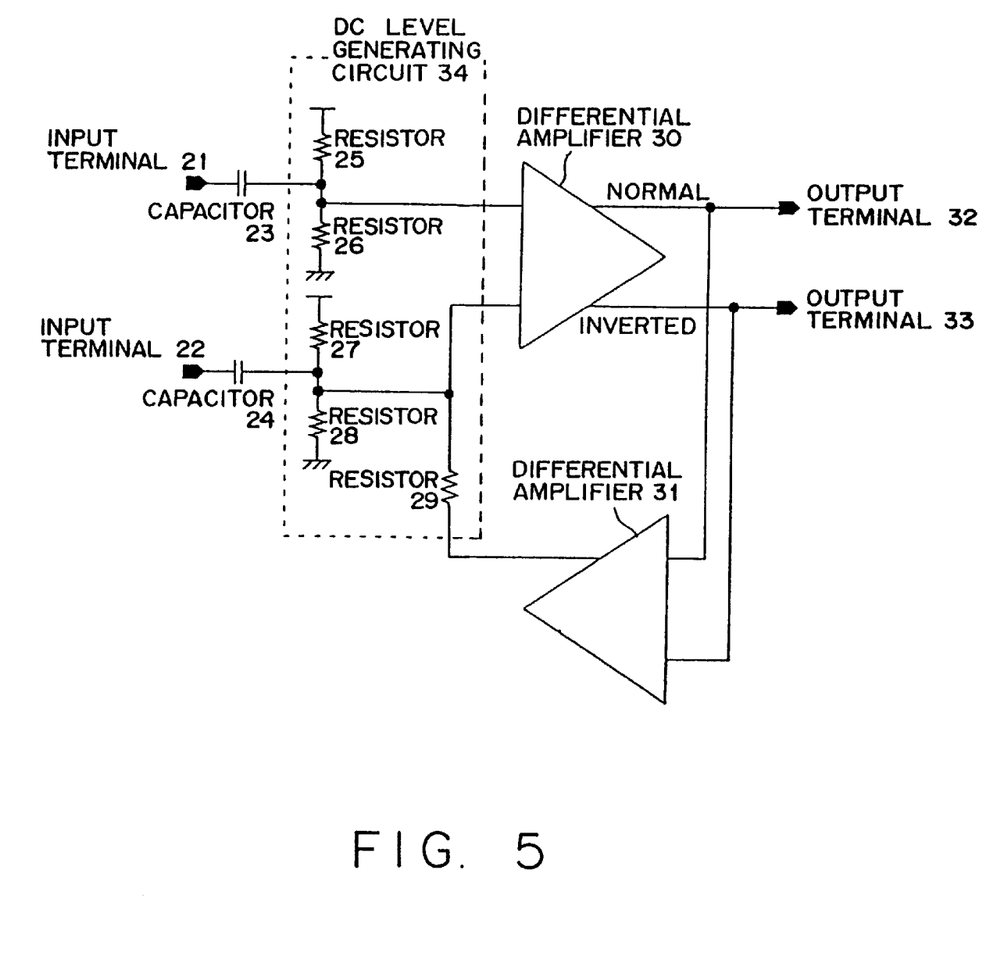
FIG. 5 shows the configuration of a first preferred embodiment according to the present invention.

FIG. 5 shows the configuration of a first preferred embodiment according to the present invention.

A normal signal and its inverted signal are respectively input to input terminals 21 and 22. DC components are removed by capacitors 23 and 24 from the input signals. A DC level generating circuit 34 is composed of resistors 25 through 29. The resistors 25 and 26 are specifically arranged to newly add a DC component to the signal from the input terminal 21, while the resistors 27 and 28 are specifically arranged to newly add a DC component to the signal from the input terminal 22. These signals are input to a differential amplifier 30, in which they are amplified. The amplified signals are output from output terminals 32 and 33 as a normal and an inverted output, and fed to a differential amplifier 31 via feedback paths. The differential amplifier 31 amplifies and outputs the difference between the normal and the inverted outputs. The output of the differential amplifier 31 is input to the differential amplifier 30 via the resistor 29.

By the way, output impedance exists on the output side of the differential amplifier 31 in actual circuitry. The impedance, the resistor 29, and the capacitor 24 are combined, so that a low-pass filter is formed. The capacitor 24 is arranged to remove a DC component from the signal from the input terminal 22, and functions as one type of a high-pass filter when seen from the input terminal 22 side. When seen from the feedback path side, the capacitor 24 also functions as a low-pass filter due to the existence of the resistor 29 and the output impedance of the differential amplifier 31. As described above, according to the present invention, the capacitor 24 is used as a low-pass filter which can set a high-frequency cut-off frequency to a desired value by arranging the resistor 29. Consequently, a high frequency component is removed from the signal output from the differential amplifier 31 and the signal includes only a DC component, when being input to the differential amplifier 30. Accordingly, this circuitry operates as a conventional DC feedback differential amplifier.

Besides, since a conventionally arranged low-pass filter does not exist on feedback paths, no high-frequency cut-off frequency is newly added to a loop gain. Consequently, a sufficient phase margin of a loop gain can be secured, thereby preventing oscillation.

Analyzed below is the phase margin of the DC feedback loop in the configuration shown in FIG. 5.

A loop gain function $f_{dcfd}(\omega)$ which starts from the connection point between the capacitor 24 and the input terminal of the differential amplifier 30, and returns to the original point via the differential amplifiers 30 and the resistor 29 is:

$$f_{dcfd}(\omega) = A_{30}A_{31} \times \frac{\left(\frac{1}{R_{27}} + \frac{1}{R_{28}} + j\omega C_{24}\right)^{-1}}{R_{29} + \left(\frac{1}{R_{27}} + \frac{1}{R_{28}} + j\omega C_{24}\right)^{-1}} = \quad (1)$$

$$A_{30}A_{31}R_{27}R_{28} \frac{1}{R_{27}R_{28} + R_{27} + R_{29}(R_{27} + R_{28} + j\omega C_{24}R_{27}R_{28})} = \quad (2)$$

$$K \times \frac{1}{1 + j\frac{\omega}{2\pi f_{c2}}} \quad (3)$$

where $$2\pi f_{c2} = \frac{(R_{27}R_{28} + R_{27}R_{29} + R_{28}R_{29})}{C_{24}R_{27}R_{28}R_{29}} \quad (4)$$

$$K = \frac{A_{30}A_{31}R_{27}R_{28}}{(R_{27}R_{28} + R_{27}R_{29} + R_{28}R_{29})} \quad (5)$$

Here, $A_{30}A_{31}$ represents the total of the gains of the differential amplifiers 30 and 31, $R_{27}$, $R_{28}$, $R_{29}$ respectively represent the values of the resistors 27, 28, and 29, and $C_{24}$ represents the value of the capacitor 24. Additionally, the input terminal 22 is assumed to have sufficiently low impedance when seen from the capacitor 24 side.

It can be seen from the above described equation (3) that the DC feedback loop has a high-frequency cut-off frequency "fc2".

The state of the above obtained loop gain and its phase are illustrated in FIG. 3.

Figure 6:
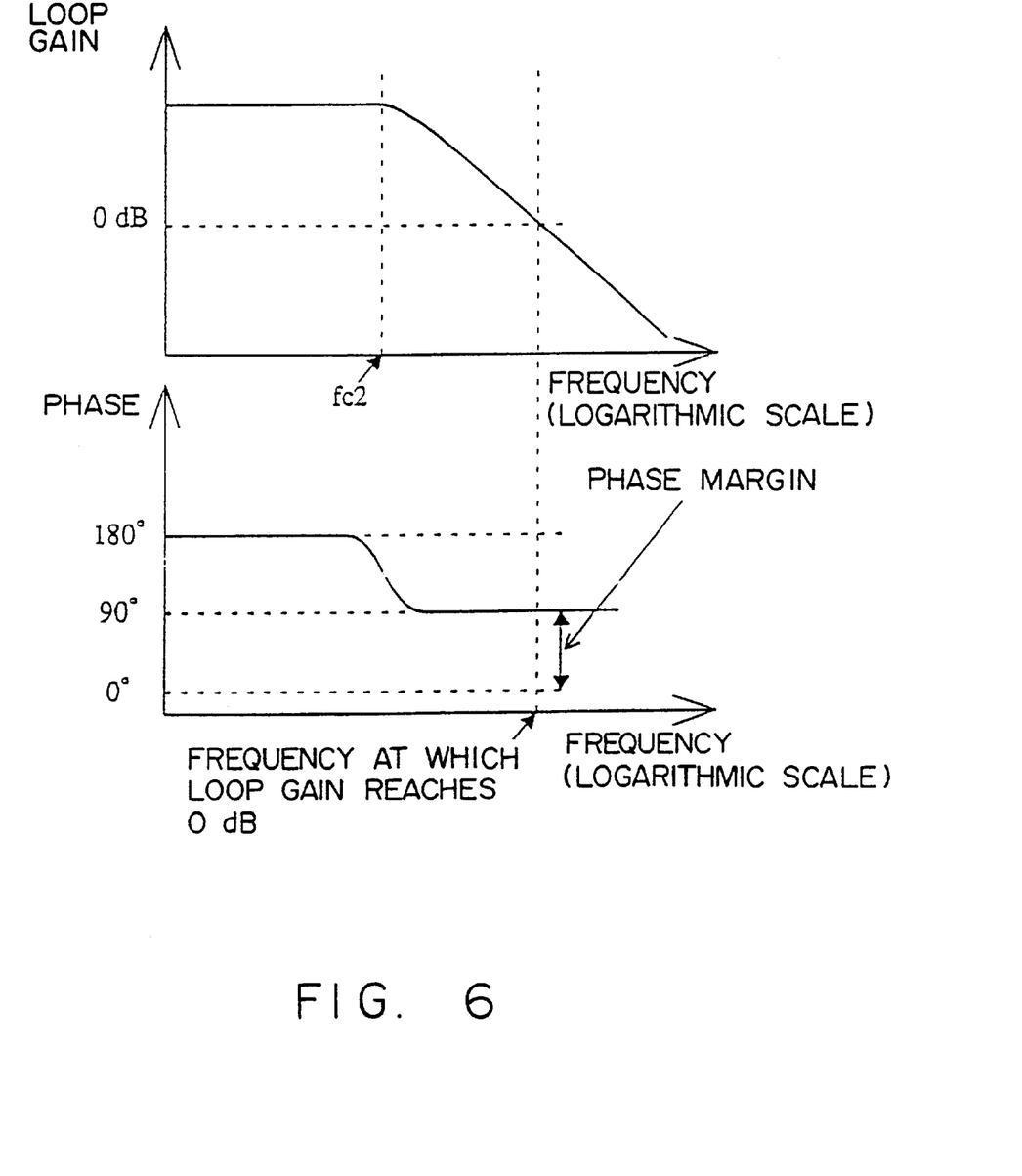
FIG. 6 shows the states of a loop gain and its phase in the first preferred embodiment.

The absolute value of the loop gain suddenly decreases at the high-frequency cut-off frequency "fc2", and drops to a value equal to or smaller than 0 dB. At this time, its phase only rotates by 90° at the high-frequency cut-off frequency "fc2" or its vicinity, and does not further rotate after that due to non-existence of a high-frequency cut-off frequency. Accordingly, the phase has a degree of 90° or so even at the frequency where the loop gain becomes 0 dB, and a phase margin of 45° or more, which is required to suppress oscillation, is secured. Namely, according to this preferred embodiment, only one high-frequency cut-off frequency exists, so that a phase margin of 90° or more can be secured, as shown in FIG. 6. Therefore, there is no possibility of oscillation.

In the meantime, because a high-frequency cut-off frequency "fc1" of the low-pass filter 80 exists on the conventional DC feedback loop shown in FIG. 7A or 7B, a loop gain function $f_{dcfb}(\omega)$ is:

$$f_{dcfb'}(\omega) = K \times \frac{1}{1 + j\frac{\omega}{2\pi f_{c1}}} \times \frac{1}{1 + j\frac{\omega}{2\pi f_{c2}}} \qquad (6)$$

Accordingly, as shown in FIG. 3, a normally required phase margin of 45° cannot be secured, which leads to oscillation.

Additionally, likewise the conventional role of the capacitor 24 for extracting only a high frequency component from an input signal, a desired low-frequency cut-off frequency can be obtained for the output terminal of the differential amplifier 31 when seen from the capacitor 24 by setting the values of the capacitor 24 and the resistors 27 and 28 to suitable values, if the resistor R29 is set to a sufficiently large value. Furthermore, a desired high-frequency cut-off frequency "fc2" can be obtained by setting the value of the resistor R29 to a suitable value.

Figure 7:
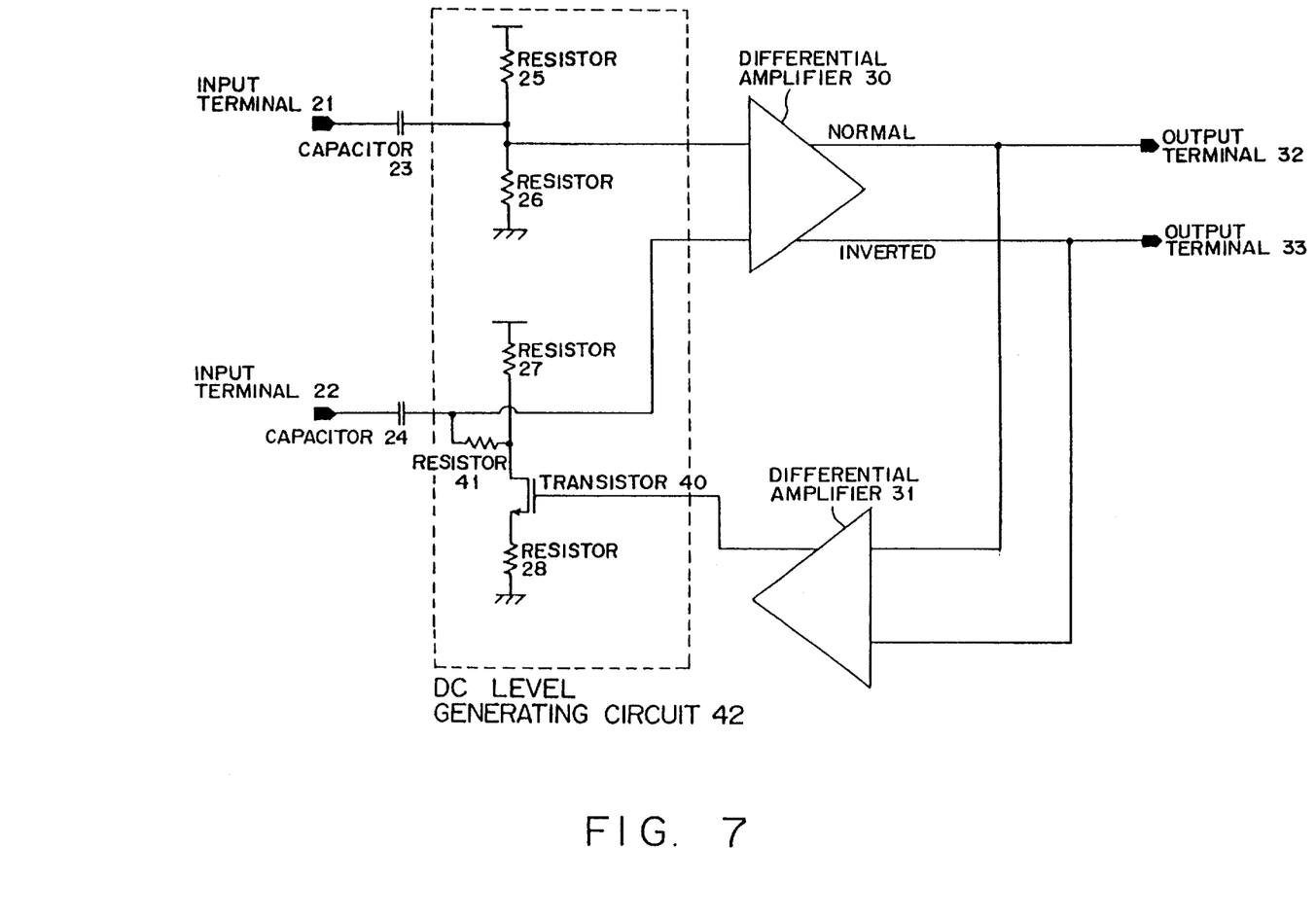
FIG. 7 shows the configuration of a second preferred embodiment.

FIG. 7 shows the configuration of a second preferred embodiment according to the present invention.

In this figure, the same constituent elements as those shown in FIG. 5 are denoted with the same reference numerals.

The first preferred embodiment has a disadvantage that there is a loss, which corresponds to the value of the resistor 29, from the differential amplifier 31 to the input terminal of the differential amplifier 30. In the meantime, the second preferred embodiment has advantages that the drain of a transistor has sufficiently large impedance, and that a loss from the differential amplifier 31 to the input terminal of the differential amplifier 30 can be eliminated.

A DC component is removed by the capacitor 23 from the signal from the input terminal 21, and a DC component set by the resistors 25 and 26 of a DC level generating circuit 42 is added to the signal, which is then input to the differential amplifier 30. Also, a DC component is removed by the capacitor 24 from the inverted signal of the signal from the input terminal 21, which is input from the input terminal 22. A DC component set by the resistors 27, 28, and 41 is added, and the signal is input to the differential amplifier 30. Here, a transistor 40 is always in an ON state, and adjusts the size of an electric current flowing between the drain and the source thereof. Accordingly, the electric current flowing into the transistor 40 increases as a feedback voltage from the differential amplifier 31 rises. Consequently, control is performed so that the voltage value of the DC component, which is applied to the signal from the input terminal 22 via the capacitor 24, becomes larger. Conversely, the voltage value of the DC component, which is applied to the signal from the input terminal 22 via the capacitor 24, decreases as the feedback voltage drops. Since the voltage applied from the differential amplifier 31 to the transistor 40 is obtained by amplifying the difference between the outputs of the differential amplifier 30, it is normally an AC voltage. However, the resistor 41 and the capacitor 24 serve as a low-pass filter and only a DC component is fed to the differential amplifier 30 in a similar manner as in the preferred embodiment shown in FIG. 5.

With the operations of the DC feedback circuit including the differential amplifier 31, a normal and an inverted signal of the differentially amplified signal whose DC component is stabilized are respectively output from the output terminals 32 and 33 of the differential amplifier 30.

Also in this case, only one high-frequency cut-off frequency is included into the feedback path by the capacitor 24 and the resistor 41. Therefore, also only one high-frequency cut-off frequency exists before the loop gain reaches 0 dB, thereby securing a phase margin of 90° or so, and preventing a feedback loop from oscillating.

Figure 8:
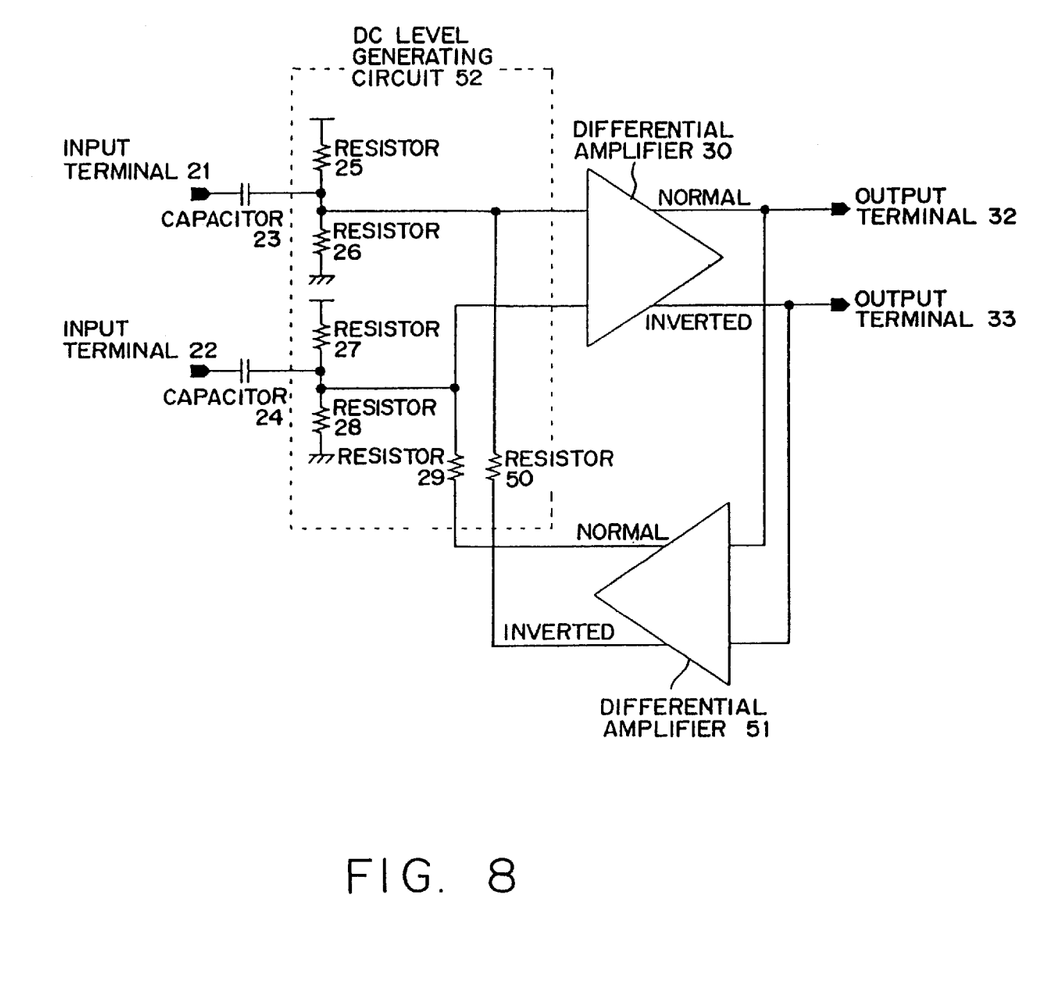
FIG. 8 shows the configuration of a third preferred embodiment.

FIG. 8 shows the configuration of a third preferred embodiment according to the present invention.

In this figure, the same constituent elements as those shown in FIG. 5 are denoted with the same reference numerals.

In this preferred embodiment, a normal output and an inverted output of a differential amplifier 51 are respectively fed back to the differential amplifier 30 via the resistors 29 and 50. In the above described preferred embodiments, a feedback operation is performed only for one of the inputs of the differential amplifier 30. This is intended to compensate for the offset between the DC components by adjusting the DC component of one of the signals (the signal from the input terminal 22). The third preferred embodiment, however, is intended to efficiently compensate for a DC offset by controlling the DC components of both of the signals from the input terminals 21 and 22.

In this preferred embodiment, a DC level generating circuit 52 is composed of resistors 25, 26, 27, 28, 29, and 50. DC components are removed by the capacitors 23 and 24 from a normal and an inverted signal from the input terminals 21 and 22. Then, predetermined DC components are added to the signals by the resistors 25 and 26, and 27 and 28, and the signals are input to the differential amplifier 30. The normal and the inverted signals, which are differentially amplified by the differential amplifier 30, are input to the differential amplifier 51 via feedback paths, so that further amplified normal and inverted signals are generated. Then, the normal signal is returned to the differential amplifier 30 via the resistor 29 in a similar manner as in the above described preferred embodiment. At this time, a DC component is extracted by the operations of the resistor 29 and the capacitor 24. Similarly, the inverted signal output from the differential amplifier 51 is input to the differential amplifier 30 via the resistor 50. Also in this case, the resistor 50 and the capacitor 23 function as a low-pass filter, in which a DC component is extracted. The signal is then input to the differential amplifier 30.

With the operations of the DC feedback circuit including the resistor 29 and that including the resistor 50, the signals whose DC component offset is compensated for are output to the output terminals 32 and 33 also in this preferred embodiment.

In the feedback circuit including the resistor 29, only one high-frequency cut-off frequency caused by the resistor 29 and the capacitor 24 exists in a frequency band where a loop gain is larger than 0 dB. Therefore, a sufficient phase margin can be secured, thereby preventing the oscillation of the circuit. Also in the feedback circuit including the resistor 50, only one high-frequency cut-off frequency by the resistor 50 and the capacitor 23 exists. Accordingly, a sufficient phase margin can be secured, thereby preventing the oscillation of the circuit.

In the conventional configuration where a low-pass filter is included in a DC feedback loop, a phase margin cannot be secured, which leads to a strong possibility of oscillation. According to the present invention, however, a sufficient phase margin can be secured, which eliminates a possibility of oscillation as described above.

What is claimed is:

1. A DC feedback differential amplification circuit, comprising:

a capacitor for removing a direct current component of an input signal;

a differential amplifier for differentially amplifying a signal;

a feedback path for feeding back an output of said differential amplifier; and a direct current level generating circuit, to which a signal from said feedback path is input, for extracting a direct current component of the signal from said feedback path, and for inputting the direct current component to said differential amplifier due to effective coupling of resistive elements and said capacitor, wherein said direct current level generating circuit is configured so that two or more high-frequency cut-off frequencies are not included into said feedback path in a frequency band where a loop gain is larger than 0 dB.

2. The differential amplification circuit according to claim 1, wherein said direct current level generating circuit newly adds a direct current component to the input signal from which the direct current component is removed by said capacitor.

3. The differential amplification circuit according to claim 1, wherein:

said direct current level generating circuit has a resistor; and a low-pass filter is configured by the resistor and said capacitor.

4. The differential amplification circuit according to claim 1, wherein:

said direct current level generating circuit comprises a transistor for controlling an electric current flowing based on the signal from said feedback path, and a resistor connected to said transistor; and a low-pass filter is configured by the resistor and said capacitor.

5. The differential amplification circuit according to claim 1, further comprising:

a first and a second terminal to which an input normal signal and an inverted signal of the normal signal are respectively input;

a first capacitor, included in said capacitor, corresponding to said first terminal;

a second capacitor, included in said capacitor, corresponding to said second terminal; and a second differential amplifier arranged on said feedback path, wherein:

said differential amplifier, to which the normal signal from said first terminal and the inverted signal from said second terminal are input, for outputting a first signal obtained by amplifying a difference between the input normal signal and the inverted signal, and a second signal obtained by inverting the first signal; and said second differential amplifier amplifiers and outputs the difference between the first and the second signals.

6. The differential amplification circuit according to claim 5, wherein:

said second differential amplifier outputs a third signal obtained by amplifying the difference between the first and the second signals, and a fourth signal obtained by inverting the third signal; and two feedback paths are formed.

7. The differential amplification circuit according to claim 6, wherein:

said direct current level generating circuit comprises a first resistor and a second resistor on the respective two feedback paths;

a first low-pass filter is formed by the first resistor and said first capacitor; and a second low-pass filter is formed by the second resistor and said second capacitor.

8. A differential amplification circuit, comprising:

a first capacitor connected to a first input terminal;

a second capacitor connected to a second input terminal;

a first differential amplifier;

a direct current level generating circuit whose input side is connected to said first capacitor and said second capacitor, and whose output side is connected to said first differential amplifier; and a second differential amplifier whose input side is connected to an output side of said first differential amplifier, and whose output side is connected to said direct current level generating circuit, wherein an effective low pass filter to pass a direct current component is made in said direct current level generating circuit due to effective coupling of resistive elements and said first and second capacitors, and wherein said direct current level generating circuit adds only one high-frequency cut-off frequency within a frequency band where a loop gain is larger than 0 dB to a feedback loop composed of said direct level generating circuit, said first differential amplifier, and said second differential amplifier.

* * * * *